(12) United States Patent
Confalonieri et al.

(10) Patent No.: US 6,934,185 B2
(45) Date of Patent: Aug. 23, 2005

(54) PROGRAMMING METHOD FOR NON VOLATILE MULTILEVEL MEMORY CELLS AND CORRESPONDING PROGRAMMING CIRCUIT

(75) Inventors: Emanuele Confalonieri, Milan (IT); Antonio Geraci, Monza (IT); Vincenzo Dima, Monza (IT); Nicola Del Gatto, Torre del Greco (IT)

(73) Assignee: STMicroelectronics S.r.l. (IT)

( * ) Notice: Subject to any disclaimer, the term of this patent is extended or adjusted under 35 U.S.C. 154(b) by 0 days.

(21) Appl. No.: 10/724,023

(22) Filed: Nov. 26, 2003

(65) Prior Publication Data

US 2004/0190336 A1 Sep. 30, 2004

(30) Foreign Application Priority Data

Nov. 28, 2002 (IT) ................................. MI2002A2531

(51) Int. Cl.$^7$ .............................................. G11C 16/04
(52) U.S. Cl. ............................. 365/185.03; 365/185.22; 365/185.19
(58) Field of Search .................... 365/185.03, 185.22, 365/185.19

(56) References Cited

U.S. PATENT DOCUMENTS 5,721,701 A * 2/1998 Ikebe et al. ............ 365/185.03
6,366,496 B1 * 4/2002 Torelli et al. .......... 365/185.19

* cited by examiner

*Primary Examiner*—Huan Hoang
(74) *Attorney, Agent, or Firm*—Lisa K. Jorgenson; P.G. Scott Born; Graybeal Jackson Haley LLP

(57) ABSTRACT

A method for management of the programming controls in a multilevel device is provided. During the control step cells are not controlled all together but they are conveniently selected in order to reduce the source resistance and consumption effect, but without penalizing change times.

25 Claims, 3 Drawing Sheets

FIG. 1 - PRIOR ART

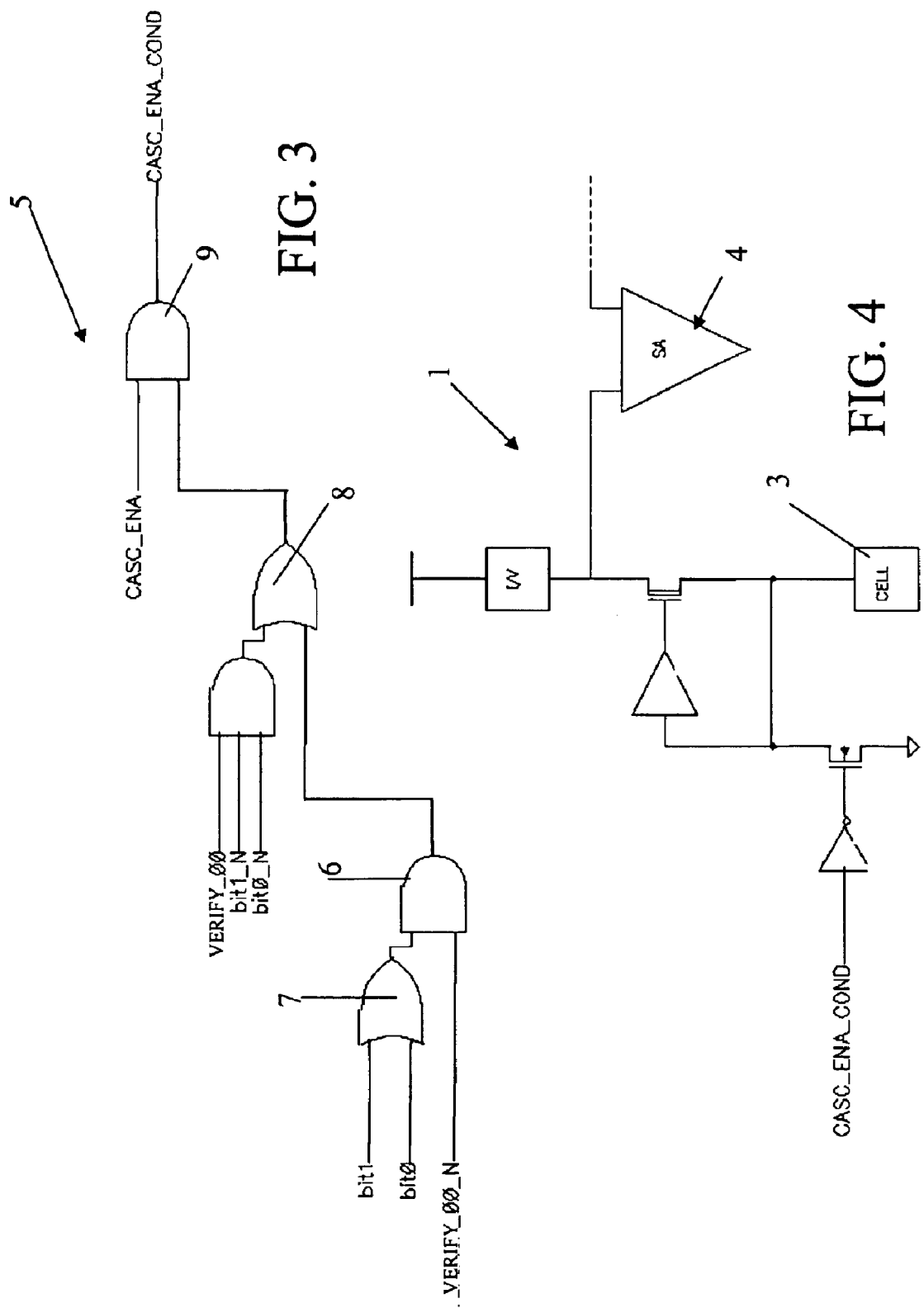

PROGRAMMING METHOD FOR NON VOLATILE MULTILEVEL MEMORY CELLS AND CORRESPONDING PROGRAMMING CIRCUIT

PRIORITY CLAIM

This application claims priority from Italian patent application No. MI2002A 002531, filed Nov. 28, 2002, which is incorporated herein by reference.

TECHNICAL FIELD

The present invention relates to a programming method of multilevel non-volatile memory cells.

More specifically, the invention relates to a programming method of multilevel non-volatile memory cells comprising a first step wherein predetermined bias voltages are respectively applied to the cell gate, drain and source terminals and providing a following control step of the just-occurred programming by means of a programming algorithm of the program-verify type.

The invention relates also to a multilevel non-volatile memory electronic device integrated on a semiconductor and comprising a matrix of non-volatile memory cells, each cell being equipped with at least a floating-gate transistor with gate, drain and source terminals, as well as comprising programming- and control-circuit portions associated with the matrix of cells.

BACKGROUND

As it is well known in this specific field of application, the urgent request by the world market for semiconductors having high-density non-volatile memories, for example of the Flash EEPROM type, led to the study and application of so-called multilevel memory devices wherein each single memory cell is capable of storing more than one bit. Each bit is associated with a predetermined logic level and level identification is allowed by the use of reference memory cells respectively having multiple threshold voltage levels.

It is quite evident to the skilled in the art that when the number of threshold voltage levels increases, the requirements needed for correctly performing the operations carried out on the cells also increase; i.e., the erasing, programming and reading operations.

In fact, for reliability reasons, the available voltage for allocating the $2^n-1$ threshold distributions (all but the most programmed one) of a multilevel non-volatile memory having n bits/cell is lower than 4.5–5V. Consequently, both the amplitudes of threshold distributions and the edges between them decrease.

Therefore, in the manufacturing step of multilevel memory devices, it is taken into consideration a series of phenomena being instead totally negligible in traditional two-level memories.

For a better understanding of the aspects of the present invention the way programming steps occur in multilevel flash memories will be examined hereafter.

The writing operation of a flash cell consists in varying the threshold voltage thereof by the amount desired, storing electrons in the floating gate region.

In order to program the cell with threshold voltage distributions having enough precision to manufacture the cell, the voltage applied on the control gate terminal can be step-variable from a minimum value up to a maximum value; the amplitude of the voltage step, in drain-terminal optimum conditions, is equal to the threshold jump to be obtained.

The use of a step-gate voltage poses a time problem to successfully accomplish the programming step; to minimize the duration of programming times it is often necessary to program a high number of cells in parallel.

In parallel multilevel programming, the most used programming algorithm is called "program & verify" and it consists in a sequence of programming pulses and controls during whose execution each programming pulse is followed by a reading step of the cells being programmed, to control if they have reached the threshold value or not.

The value of the gate voltage is increased at each pulse, keeping the drain voltage constant. Between consecutive programming pulses, the cells are controlled and if they have reached the desired state, they are removed from the set of cells to be programmed.

In order to increase the programming throughput, more words are programmed in parallel. The programming of more words requires higher currents and this implies designing charge pumps having higher-current capacities.

Moreover, the parallel programming of more words also means the parallel control thereof. The trend in multilevel memories is to perform controls being as similar as possible to readings, except for the reference position. A control intrinsic difference, with respect to reading, is linked to the state of word cells. During programming the cell state is evolving and thus each control will have different outline conditions. During a reading the cell state is fixed.

An important outline condition is linked to the bias of the source terminal.

The cell source bias inevitably occurs through a resistive path. The real source voltage depends then on the current flowing in the bias line thereof, and this current depends on the overall state of the word cells being controlled.

The effect of this source resistance will be briefly described. For simplicity the programming of two cells will only be considered, the first from state "11" to state "10", the second from state "11" to state "00", making reference to the schematic example of FIG. 1.

The programming starts with a sequence of programming and control pulses. During controls both cells carry the current. At a certain point the first cell reaches the state "10", it is released and programming continues up to bring the second cell in the state "00".

If at this point a new control of the two cells is performed, the situation seems changed. In fact, at the beginning of the algorithm, the source of the first cell was at a higher potential than the potential reached when the second cell reaches the state "00".

Therefore, the cell "10" is more conductive, and in practice it is as if it shifted towards the distribution "11".

A technical solution has been recently provided to remedy the phenomenon being described, which consists in modifying the programming algorithm with a mode called "Repeated Slope". In substance, it consists of controlling again the cell state at the end of the programming and eventually in reprogramming only those cells that were shifted towards an erasing state.

This solution involves, however, a time extension because of the changes following the control.

SUMMARY

Consequently, and embodiment of the present invention provides a programming method for multilevel non-volatile memory cells, which has such functional features as to allow the source resistance impact to be dramatically reduced during the control steps of the program-verify algorithm.

This embodiment of the present invention is particularly simple and it provides for not controlling, or skipping the control step, for some cells having to reach a predetermined logic state. Therefore, the cells are not controlled all together but they are conveniently selected in order to reduce the source resistance and consumption effect.

BRIEF DESCRIPTION OF THE DRAWINGS

Features and advantages of the methods and circuits according to the invention will be apparent from the following description of an embodiment thereof given by way of non-limiting example with reference to the attached drawings.

FIG. 3 is a schematic view of a circuit portion of an electronic memory device effective to implement the method of FIG. 2 according to an embodiment of the invention;

FIG. 4 is a schematic view of a further circuit portion of the electronic device according to an embodiment of the invention.

DETAILED DESCRIPTION

Figure 1:
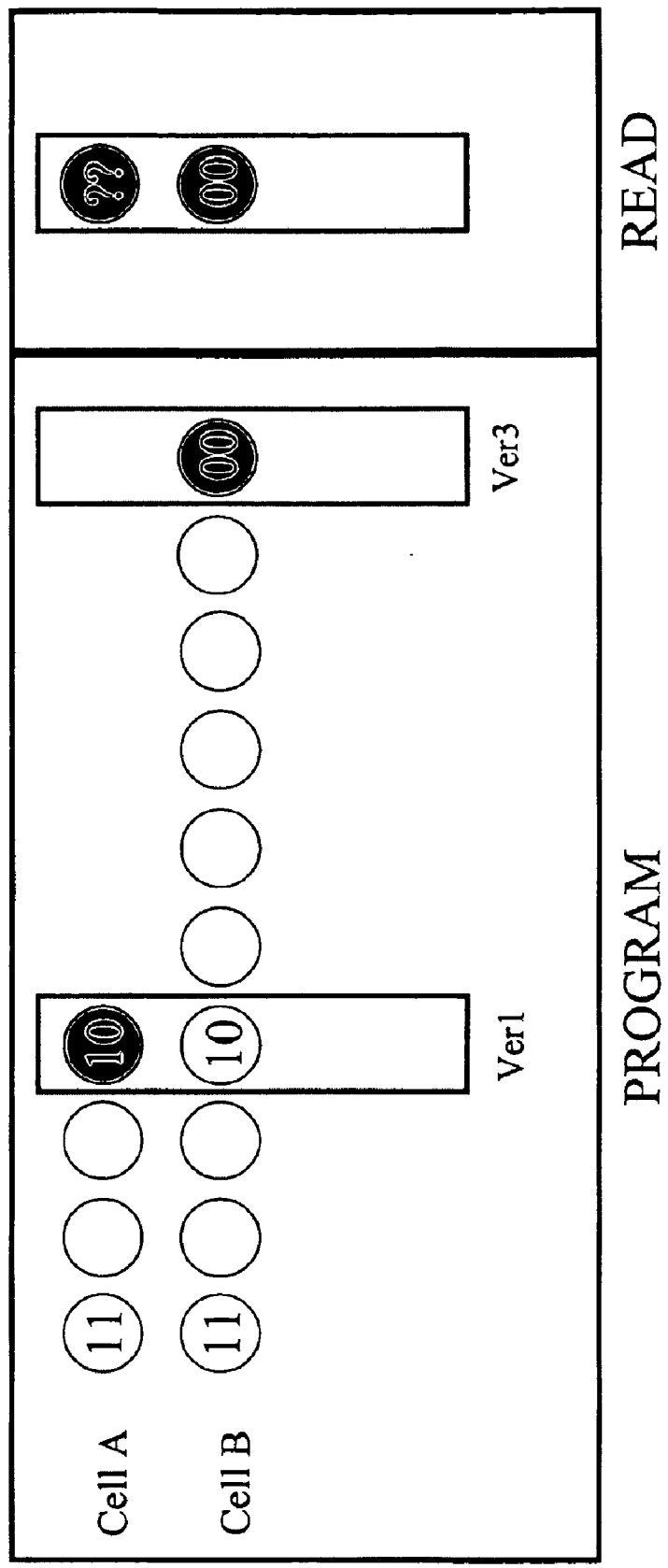
FIG. 1 is a schematic view of a known programming method for a multilevel memory cell having two bits per cell.
Figure 2:
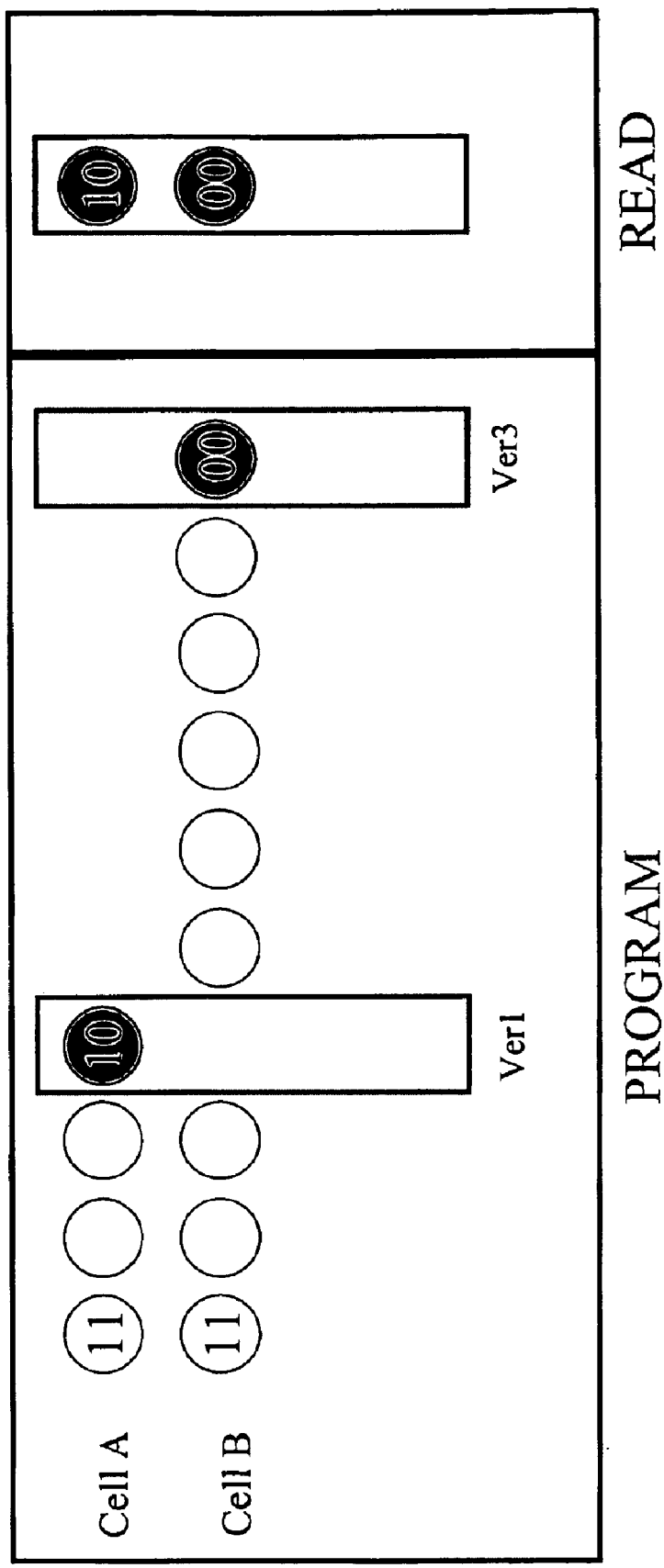
FIG. 2 is a schematic view of a programming method according to an embodiment of the invention for a multilevel memory cell having two bits per cell.

With reference to these drawings, and particularly to the example of FIGS. 2, 3 and 4, a control circuit portion according to an embodiment of the present invention for an electronic memory device is globally and schematically indicated with 1, in order to implement a method according to an embodiment of the invention and conveniently program multilevel non-volatile memory cells 3.

Memory device means any monolithic electronic system incorporating a matrix of memory cells, organized in rows and columns and circuit portions associated with the cell matrix and responsible for addressing, decoding, reading, writing and erasing the memory-cell content.

Such a device can be for example a memory chip integrated on semiconductor and of the non-volatile flash EEPROM type split in sectors and electrically erasable.

Each memory cell comprises a floating gate transistor with source S, drain D and control gate G terminals.

FIG. 4 schematically shows by way of example a cell 3 inserted on a word line WL and on a related bit line with associated reading amplifier 4.

The above-mentioned program-load and program-verify programming circuits are provided between the circuit portions associated with the matrix of cells, each circuit is supplied by a specific supply voltage generated in the integrated memory circuit and regulated by means of a drain-voltage regulator.

According to an embodiment of the present invention, a change of the structure of the circuit portion responsible for the control step has been provided.

With particular reference to the examples of FIGS. 3 and 4, it can be noted that FIG. 3 schematically shows a logic network 5 comprising a plurality of AND and NOR gates being parallel-and-cascade-connected to each other.

The network 5 receives at an input of an AND logic gate 6 a signal Verify_00, while the output of a NOR logic gate 7 is applied on the other input of the same logic gate, receiving at the input thereof the logic signals corresponding to the logic state of a pair of bits to be controlled.

The output of the logic gate 6 is applied at the input of a following NOR logic gate 8 receiving at another input the output of an AND logic gate receiving at the input thereof all the signals applied to gates 6 and 7.

The output of the gate 8 is applied at an input of a following AND gate 9 receiving on the other input thereof an enable signal Casc_Ena. The signal Casc_Ena_Cond outputted by this logic gate 9 is applied to the memory cell bit line for which the skip of the control step is provided, according to an embodiment of the present invention.

The cells not undergoing the control are those having to reach the logic state "00", i.e. the full programming state.

During the programming of the cells in states "10" and "01", the cells having to reach "00" are not controlled. Programming pulses are applied in parallel to all the cells having not reached the desired threshold yet. Once the positioning of the cells in "10" and "01" occurs, the following controls involve only those cells which should have become "00".

In substance, this embodiment of the invention relates to the management of programming controls in a multilevel device. During the control step, cells are not controlled all together but they are conveniently selected in order to reduce the source resistance and consumption effect, but without penalizing change times.

Therefore, according to this embodiment of the present invention, during the programming and control pulse slope, performed for programming the cells in states "10" and "01", cells 3, which must reach the state "00", are not controlled.

Therefore, their contribution to the source current is void, as it will be for their contribution during a future reading.

Once the positioning of the cells in states "10" and "01" occurred, the following controls involve only those cells which should have reached the state "00".

For example, as well shown in FIG. 2, when the cell A overcomes the control (Ver 1) the system is in state being very similar to the state which will appear in a following reading. Because of the fact that in state "00" the cell does not draw any current.

The disabling of the control step of a given cell simply occurs by keeping the bit-line thereof to ground according to the combined scheme shown in FIGS. 3 and 4.

Skipping or non-considering the cells of logic distributions "11", "10" and "01", when the cells of the distribution "00" instead occur, involves a more marginal positioning of the same cells.

In other words, always because of the source resistance effect, the final state of these cells will be more programmed than what has been seen from the control.

The method being provided is very simple and it allows then the source resistance effect on the distribution increase to be reduced. A further advantage of the method being provided is the consumption reduction, in particular of those linked to the bit-line charge.

The above-illustrated solution, acting to selectively perform the control step, allows the source resistance effect on the logic value distribution to be dramatically reduced, reducing the memory device consumption in the programming step.

An integrated circuit, such as a memory, which includes non-volatile memory cells and the circuitry of FIGS. 3 and 4 may be incorporated into a system such as a computer system.

From the foregoing it will be appreciated that, although specific embodiments of the invention have been described herein for purposes of illustration, various modifications may be made without deviating from the spirit and scope of the invention.

What is claimed is:

1. A programming method for multilevel non-volatile memory cells comprising a first step wherein predetermined bias voltages are applied to the cell gate, drain and source terminals and providing a following control step of the programming just occurred by means of a programming algorithm of a program-verify type, wherein the control step is skipped for some cells which have to reach a predetermined logic state.

2. A method according to claim 1 wherein said predetermined logic state is the state "00".

3. A method according to claim 1 wherein the control of said some cells is performed only after a part of the remaining cells has reached the programmed state.

4. A programming method for multilevel non-volatile memory cells comprising a first step wherein predetermined bias voltages are applied to the cell gate, drain and source terminals and providing a following control step of the programming just occurred by means of a programming algorithm of a program-verify type, wherein the control step is skipped for some cells which have to reach a predetermined logic state, and wherein the control step for said some cells is skipped by connecting to a ground potential reference the bit-line whereto these cells are connected.

5. A method according to claim 4 wherein it provides the use of a logic disabling network associated with control circuit portions of the memory device.

6. A multilevel non-volatile memory electronic device integrated on a semiconductor and comprising a matrix of non volatile memory cells, each cell being equipped with at least a floating gate transistor with gate, drain and source terminals, and comprising programming and control circuit portions associated with the cell matrix, wherein the control circuit portion comprises a logic network to disable a control step only for some cells having to reach a predetermined logic state.

7. A device according to claim 6 wherein said predetermined logic state is the state "00".

8. A device according to claim 6 wherein the control of said some cells is enabled only after a part of the remaining cells has reached the predetermined logic state.

9. A multilevel non-volatile memory electronic device integrated on a semiconductor and comprising a matrix of non volatile memory cells, each cell being equipped with at least a floating gate transistor with gate, drain and source terminals, and comprising programming and control circuit portions associated with the cell matrix, wherein the control circuit portion comprises a logic network to disable a control step only for some cells having to reach a predetermined logic state, wherein the control of said some cells is disabled by connecting to a ground potential reference the bit-line whereto these cells are connected.

10. A method, comprising:
partially programming first and second multilevel non volatile memory cells having respective first and second states; and
determining the first state but not determining the second state.

11. The method of claim 10 wherein determining the first state comprises comparing the first state to a first predetermined value.

12. The method of claim 10 wherein determining the first state comprises determining whether the first state represents a first predetermined value.

13. The method of claim 10 wherein determining the first state comprises determining whether the first state represents a logic 01.

14. The method of claim 10 wherein determining the first state comprises determining whether the first state represents a logic 10.

15. The method of claim 10, further comprising repeating the partial programming and determining until the first state represents a first predetermined value.

16. The method of claim 10, further comprising:
repeating the partial programming and determining until the first state represents a first predetermined value; and
after the first state represents the first predetermined value, continuing to partially program the second memory cell but not the first memory cell.

17. The method of claim 10, further comprising:
repeating the partial programming and determining until the first state represents a first predetermined value;
after the first state represents the first predetermined value, partially programming the second memory cell but not the first memory cell;
determining the second state of the second memory cell but not determining the first state of the first memory cell; and
repeating the partial programming of the second cell and the determining of the second state until the second state represents a second predetermined value.

18. The method of claim 10, further comprising:
repeating the partial programming and determining until the first state represents a first predetermined value;
after the first state represents the first predetermined value, partially programming the second memory cell but not the first memory cell;
determining the second state of the second memory cell but not determining the first state of the first memory cell; and
repeating the partial programming of the second cell and the determining of the second state until the second state represents a logic 00.

19. The method of claim 10, further comprising:
repeating the partial programming and determining until the first state represents a first predetermined value;
after the first state represents the first predetermined value, partially programming the second memory cell but not the first memory cell;
determining the second state of the second memory cell but not determining the first state of the first memory cell; and
repeating the partial programming of the second cell and the determining of the second state until the second state represents a fully programmed value.

20. An integrated circuit, comprising:
first and second multilevel non volatile memory cells having respective first and second states; and
programming circuitry coupled to the first and second memory cells and operable to,
provide respective programming pulses to the first and second memory cells, and
after providing the programming pulses, measure the first state but not the second state.

21. The integrated circuit of claim 20 wherein measuring the first state comprises determining whether the first state represents a first predetermined value.

22. The integrated circuit of claim 20 wherein the programming circuitry is further operable to sequentially provide additional respective programming pulses and to measure the first state but not the second state until the first state represents a first predetermined value.

23. The integrated circuit of claim 20 wherein the programming circuitry is further operable to:

sequentially provide additional respective programming pulses and to measure the first state but not the second state until the first state represents a first predetermined value; and after the first state represents the first predetermined value, to continue providing programming pulses to the second memory cell but not to the first memory cell.

24. The integrated circuit of claim 20 wherein the programming circuitry is further operable to:

sequentially provide additional respective programming pulses and to measure the first state but not the second state until the first state represents a first predetermined value; and after the first state represents the first predetermined value, to sequentially provide programming pulses to the second memory cell but not to the first memory cell and measure the second state of the second memory cell but not the first state of the first memory cell until the second state represents a second predetermined value.

25. An electronic system, comprising:

an integrated circuit, comprising, first and second multilevel non volatile memory cells having respective first and second states, and programming circuitry coupled to the first and second memory cells and operable to, provide respective programming pulses to the first and second memory cells, and after providing the programming pulses, measure the first state but not the second state.

* * * * *